US012604774B2

(12) United States Patent (10) Patent No.: US 12,604,774 B2
Azizan et al. (45) Date of Patent: Apr. 14, 2026

(54) ELECTRICAL CONNECTION ELEMENT AND CORRESPOND METHOD AND APPARATUS WITH OUTGASSING GROOVES THAT REMOVE TRAPPED GASSES

(71) Applicant: Infineon Technologies AG, Neubiberg (DE)

(72) Inventors: Suhaimi Azizan, Kajang (MY); Melvin Levardo, Carmona (PH); Milad Mostofizadeh, Munich (DE)

(73) Assignee: Infineon Technologies AG, Neubiberg (DE)

( * ) Notice: Subject to any disclaimer, the term of this patent is extended or adjusted under 35 U.S.C. 154(b) by 450 days.

(21) Appl. No.: 18/135,828

(22) Filed: Apr. 18, 2023

(65) Prior Publication Data

US 2024/0355772 A1 Oct. 24, 2024

(51) Int. Cl.
| *H01L 23/00* | (2006.01) |
| *H01L 25/07* | (2006.01) |
| *H01L 23/31* | (2006.01) |

(52) U.S. Cl.
CPC .............. *H01L 24/37* (2013.01); *H01L 24/40* (2013.01); *H01L 24/84* (2013.01); *H01L 25/072* (2013.01); *H01L 23/3107* (2013.01); *H01L 2224/37012* (2013.01); *H01L 2224/37124* (2013.01); *H01L 2224/37147* (2013.01); *H01L 2224/37639* (2013.01); *H01L 2224/37644* (2013.01); *H01L 2224/37655* (2013.01); *H01L 2224/37664* (2013.01); *H01L 2224/37669* (2013.01); *H01L 2224/40101* (2013.01); *H01L 2224/40111* (2013.01); *H01L*

*2224/40137* (2013.01); *H01L 2224/40247* (2013.01); *H01L 2224/84815* (2013.01); *H01L 2924/13055* (2013.01); *H01L 2924/13064* (2013.01); *H01L 2924/13091* (2013.01)

(58) Field of Classification Search
CPC ......... H01L 24/37; H01L 24/40; H01L 23/48; H01L 24/80
USPC ......................................................... 257/693
See application file for complete search history.

(56) References Cited

U.S. PATENT DOCUMENTS

| 2007/0114352 | A1 | 5/2007 | Victor et al. | |
| 2020/0176342 | A1 | 6/2020 | Choi et al. | |
| 2020/0395269 | A1* | 12/2020 | Dubey .................. | H01L 23/42 |
| 2022/0139724 | A1 | 5/2022 | Yandoc et al. | |
| 2023/0094794 | A1 | 3/2023 | Stoek et al. | |

FOREIGN PATENT DOCUMENTS

| KR | 20150129269 A | 11/2015 |
| KR | 20170012927 A | 2/2017 |

* cited by examiner

*Primary Examiner* — Quoc D Hoang
(74) *Attorney, Agent, or Firm* — Murphy, Bilak & Homiller, PLLC

(57) ABSTRACT

A electrical connection element includes a planar mating surface adapted for mating with a metal bonding surface, a rim that forms an enclosed shape around the planar mating surface, and a plurality of outgassing grooves formed in the planar mating surface, wherein each of the outgassing grooves comprises a proximal end that is spaced apart from the rim and a distal end that intersects the rim, and wherein a cross-sectional area of each of the outgassing grooves increases along a lengthwise direction going from the proximal end to the distal end.

22 Claims, 8 Drawing Sheets

ELECTRICAL CONNECTION ELEMENT AND CORRESPOND METHOD AND APPARATUS WITH OUTGASSING GROOVES THAT REMOVE TRAPPED GASSES

BACKGROUND

Many applications such as automotive and industrial applications utilize semiconductor packages to accommodate high voltage loads. These semiconductor packages can be configured as discrete components or may be configured as power converter circuits such as single and multi-phase half-wave rectifiers, single and multi-phase full-wave rectifiers, voltage regulators, etc. These semiconductor packages can include power devices such as diodes, IGBTs (insulated gate bipolar transistors), MOSFETs (metal oxide semiconductor field effect transistors), HEMTs (high electron mobility transistors), etc. Thermal and electrical performance play an increasing role in the advancement of semiconductor packages. These factors, coupled with miniaturization and increased performance, demand a high-performance attachment process and material for electrically and/or thermally coupling the components of a semiconductor package together.

SUMMARY

An electrical connection element is disclosed. According to an embodiment, the electrical connection element comprises a planar mating surface adapted for mating with a conductive bonding surface, a rim that forms an enclosed shape around the planar mating surface, and a plurality of outgassing grooves formed in the planar mating surface, wherein each of the outgassing grooves comprises a proximal end that is spaced apart from the rim and a distal end that intersects the rim, and wherein a cross-sectional area of each of the outgassing grooves increases along a lengthwise direction going from the proximal end to the distal end.

A method of forming an electrical connection in a semiconductor device is disclosed. According to an embodiment, the method comprises providing an electrical connection element that comprises a planar mating surface, a rim that forms an enclosed shape around the planar mating surface, and a plurality of outgassing grooves formed in the planar mating surface, wherein each of the outgassing grooves comprises a proximal end that is spaced apart from the rim and a distal end that intersects the rim, and wherein a cross-sectional area of each of the outgassing grooves increases along a lengthwise direction going from the proximal end to the distal end; providing an assembly of a semiconductor die mounted on a die pad with a bond pad of the semiconductor die facing away from the die pad, applying a region of solder material to the bond pad; arranging the planar mating surface of the electrical connection element on the region of solder material; and performing a solder reflow step that reflows the region of solder material to form a soldered joint between the bond pad and the electrical connection element.

A semiconductor package is disclosed. According to an embodiment, the semiconductor package comprises, a semiconductor die mounted on a die pad with a bond pad of the semiconductor die facing away from the die pad; an electrical connection element that comprises a planar mating surface, a rim that forms an enclosed shape around the planar mating surface, and a plurality of outgassing grooves formed in the planar mating surface, wherein each of the outgassing grooves comprises a proximal end that is spaced apart from the rim and a distal end that intersects the rim, and wherein a cross-sectional area of each of the outgassing grooves increases along a lengthwise direction going from the proximal end to the distal end; and a soldered joint between the planar mating surface of the electrical connection element and the bond pad of the semiconductor die.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 3A and 3B, illustrates a cross-sectional view of the electrical connection element, according to an embodiment. FIG. 3A illustrates the electrical connection element along the cross-sectional plane I-I' identified in FIG. 2; and FIG. 3B illustrates the electrical connection element along the cross-sectional plane II-II' identified in FIG. 2.

FIG. 8A illustrates a side-view of the assembly; and FIG. 8B illustrates a plan-view perspective of an interfacing side of the electrical connection element used in the assembly.

DETAILED DESCRIPTION

Embodiments of an electrical connection element, method of forming an electrical connection in a semiconductor device using the electrical connection element, and a semiconductor package comprising the electrical connection element are disclosed herein. The electrical connection element has an advantageous design that removes trapped gasses from the solder material that it interfaces with during the soldering process. In more detail, a planar mating surface of the electrical connection element that interfaces with solder material during the soldering process comprises outgassing grooves. These outgassing grooves form channels that originate within a central part of the planar mating surface and extend longitudinally to an outer rim of the electrical connection element. This forms an outlet that permits gasses that form within the solder material to escape to the ambient environment. The outgassing grooves are configured such that a cross-sectional area of each outgassing groove increases along a lengthwise direction moving towards the outer rim of the electrical connection element. This configuration facilitates transport of the gas by creating a pressure differential that naturally aspirates the gas through the outgassing groove and into the ambient environment. By reducing the volume of gas trapped within the solder material, the mechanical, thermal, and electrical properties of the soldered joint interfacing with the electrical connection element are improved.

Figure 1:
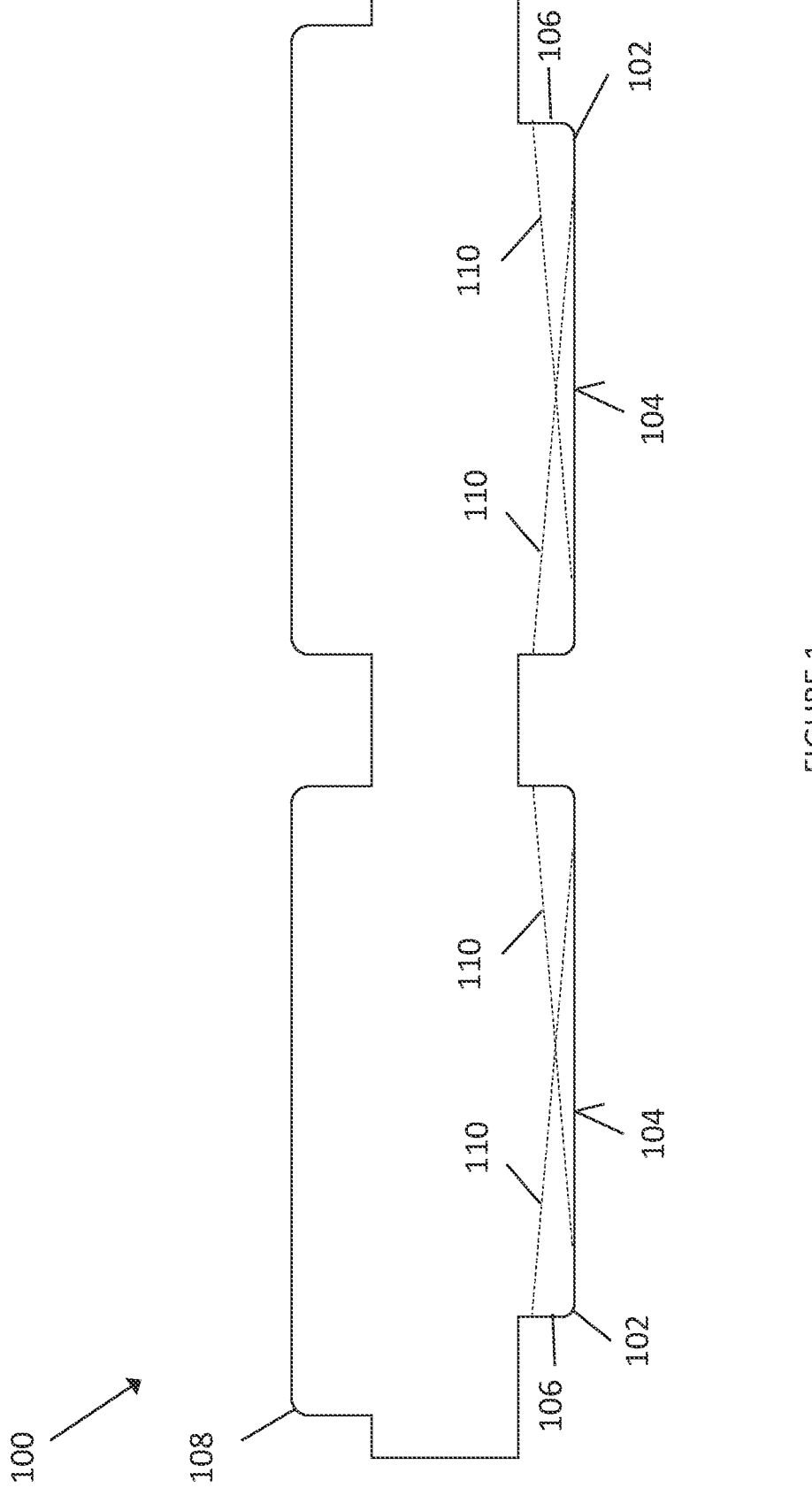
FIG. 1 illustrates a side-view perspective of an electrical connection element, according to an embodiment.

Referring to FIG. 1, an electrical connection element 100 is shown from a side-view perspective. The electrical connection element 100 may comprise an electrically and thermally conductive base material such as copper, aluminum, and alloys thereof. The electrical connection element 100 may be formed from an undisturbed planar sheet of the base material that is similar or identical to a metal sheet used to form a package lead frame. The geometric features of the electrical connection element 100 described herein may be created by performing metal processing steps such as punching, stamping, etching bending, cutting, etc. The base material of the metal connection can be plated with one or more layers of conductive material, e.g., Ni, Ag, Au, Pd, Pt, Ni, etc., which may act as adhesion promotors, anti-corrosion layers, etc.

Figure 6:
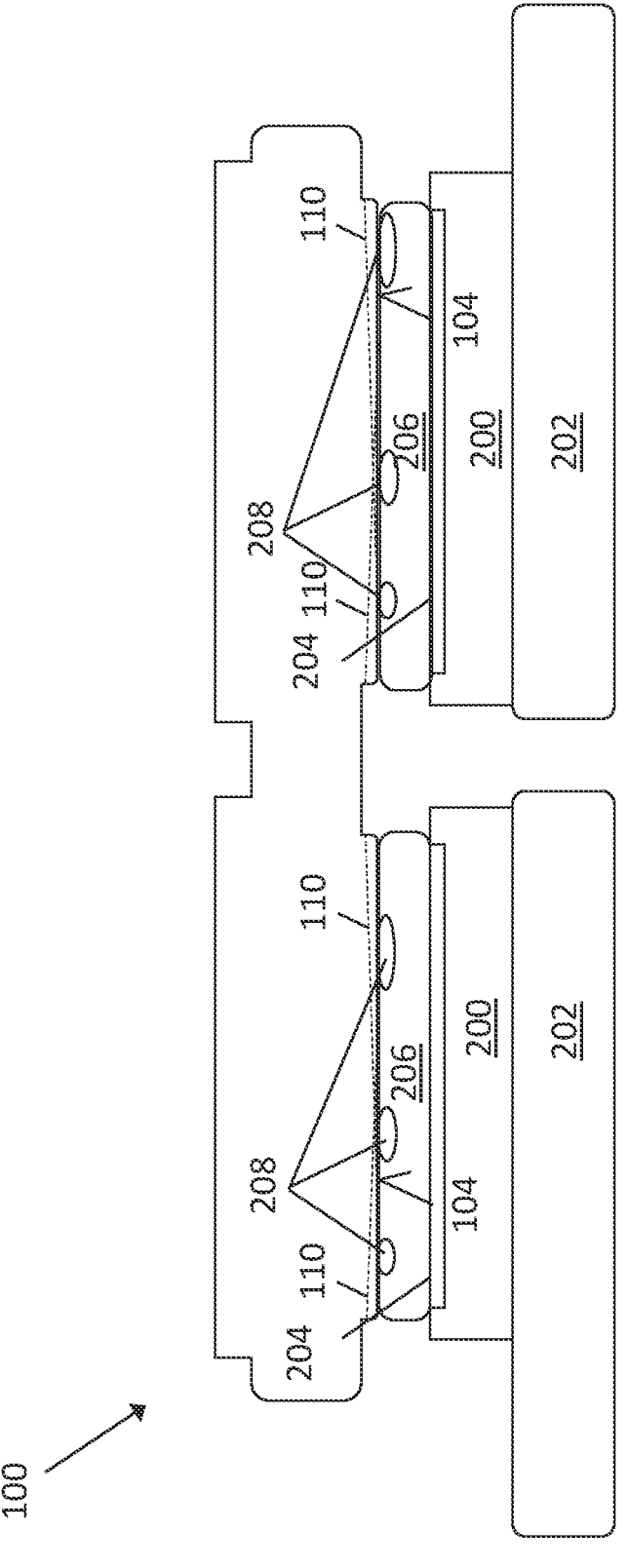

In the embodiment of FIG. 1, the electrical connection element 100 is configured as a metal interconnect clip that is configured to mate with bond pads from two separate semiconductor dies and form an electrical interconnection therebetween, e.g., as shown in FIG. 6. To this end, the electrical connection element 100 comprises two mating platforms 102 that are each configured to mate with an individual die. Each mating platform 102 comprises a planar mating surface 104 and a rim 106. The planar mating surface 104 is adapted for mating with an electrically conductive bonding surface, such as a bond from a semiconductor die or a surface from a circuit carrier. The rim 106 forms an enclosed shape around the planar mating surface 104. In addition to the rectangular shaped rim 106 as shown in the figures, other geometries for the rim 106 are possible. The rim 106 forms an angled intersection with the planar mating surface 104. For example, the rim 106 may be oriented substantially perpendicularly to the planar mating surface 104, i.e., within +/−10 degrees of perpendicular to the planar mating surface 104. In the depicted embodiment, the electrical connection element 100 additionally comprises elevated sections 108 opposite from the mating platforms 102. These elevated sections 108 may be exposed from an upper surface of a package body and/or may be mated with an external heat sink structure, thereby providing a dual interconnect clip/heat sink device.

Figure 2:
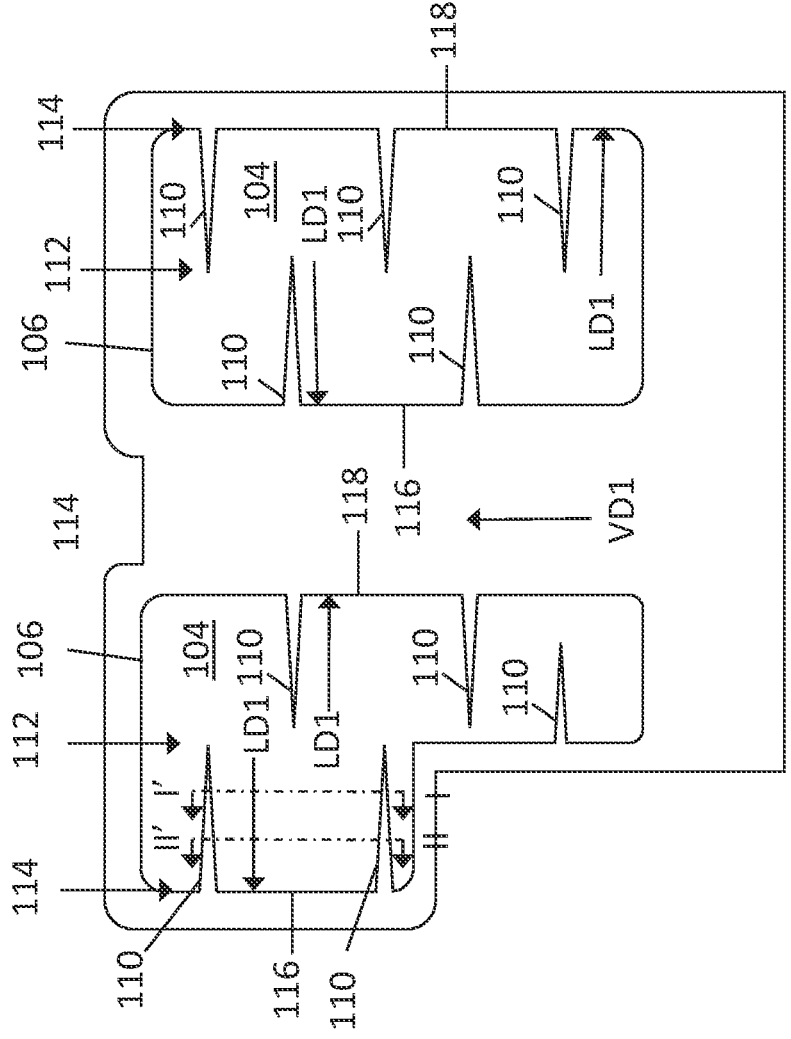
FIG. 2 illustrates a plan-view perspective of an interfacing side of an electrical connection element, according to an embodiment.

Referring to FIG. 2, an interfacing side of the electrical connection element 100 is shown. The electrical connection element 100 comprises a plurality of outgassing grooves 110 formed in each planar mating surface 104. The outgassing grooves 110 are intentionally formed trench-like structures that extend inward from the planar mating surface 104 of the electrical connection element 100. The outgassing grooves 110 may be created by processing an initially completely planar mating surface 104 using a metal processing technique, e.g., etching, cutting, stamping, etc., to remove metal or other otherwise disturb the planarity of the surface. Each of the outgassing grooves 110 comprises a proximal end 112 that is spaced apart from the rim 106 and a distal end 114 that intersects the rim 106. The outgassing grooves 110 thus form a channel that extends from an interior location within the planar mating surface 104 to an exit port located at the rim 106. From a plan-view perspective, the outgassing grooves 110 may have an elongated geometry, meaning that the length of the outgassing groove 110 between the proximal end 112 and the distal end 114 exceeds the width of the outgassing groove 110. In the depicted embodiment, each of the outgassing grooves 110 is configured as a triangle that widens along a lengthwise direction LD1 going from the proximal end 112 to the distal end 114.

Figure 3:
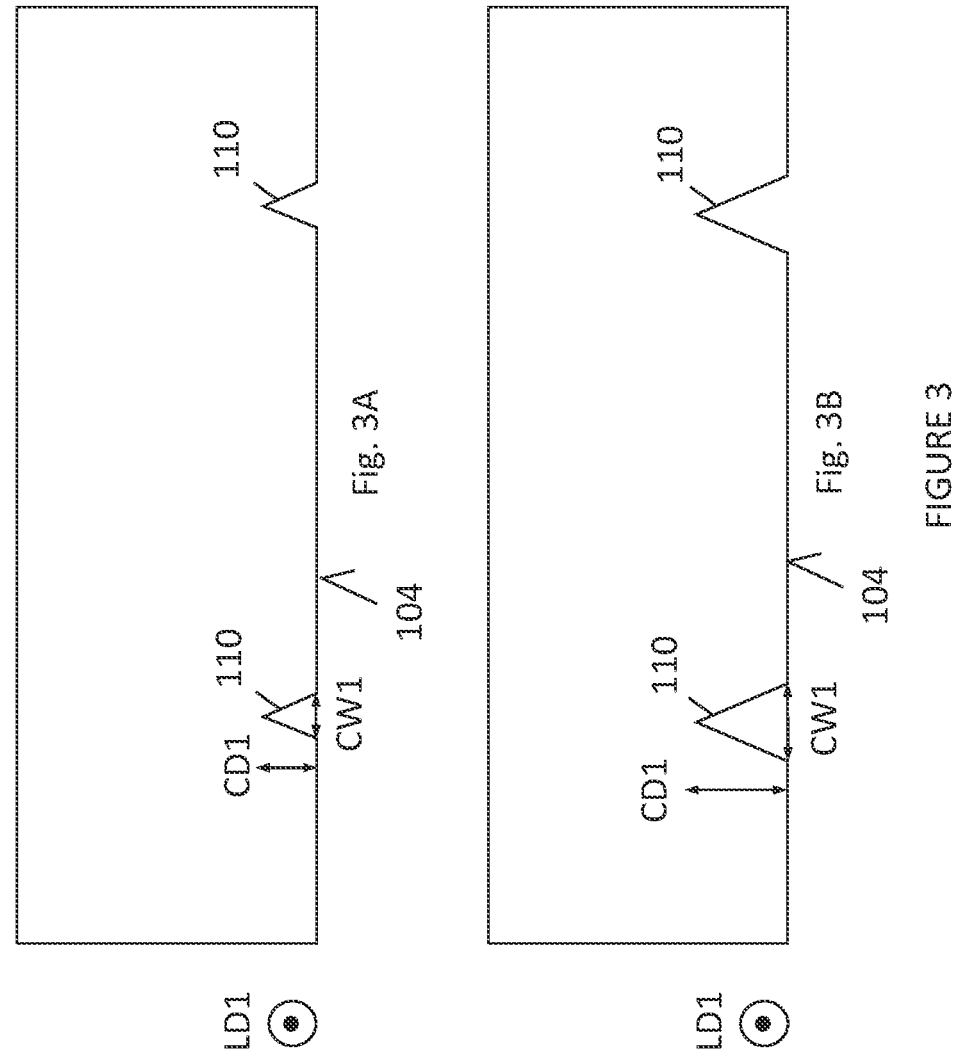
FIG. 3, which includes

Referring to FIG. 3, the geometries of the outgassing grooves 110 are shown from a cross-sectional perspective. FIG. 3A shows the geometry of the outgassing grooves 110 along the cross-sectional plane I-I' identified in FIG. 2; and FIG. 3B shows the geometry of the outgassing grooves 110 along the cross-sectional plane II-II' identified in FIG. 2. As can be appreciated from these figures, the cross-sectional area of each of the outgassing grooves 110 increases along the lengthwise direction LD1. In the depicted embodiment, the outgassing grooves 110 have v-shaped cross-sectional geometry, i.e., a geometry wherein the walls of the outgassing groove 110 are planar and intersect one another at an acute point. The outgassing grooves 110 are deeper and wider in the cross-sectional plane II-II' that is closer to the distal end 114 than in the cross-sectional plane I-I' that is closer to the proximal end 112 of the outgassing groove 110. In this case, the outgassing grooves 110 are configured such that the cross-sectional depth CD1 of the outgassing groove 110, i.e., a distance between a bottom of the outgassing groove 110 and the planar mating surface 104, and the cross-sectional width CW1 of the outgassing groove 110, i.e., the distance between the walls of the outgassing groove 110 along the cross-sectional plane, each increase in the lengthwise direction LD1.

The illustrated outgassing grooves 110 represent just one potential geometry. More generally, the outgassing grooves 110 may have a variety of different geometries wherein the cross-sectional area increases along the lengthwise direction LD1. These include geometries wherein one of the cross-sectional depth CD1 and the cross-sectional width CW1 increases along the lengthwise direction LD1, with the other one of the cross-sectional depth CD1 and the cross-sectional width CW1 remaining constant along at least a portion of the respective groove 110. In one particular example, the outgassing groove 110 may be configured such that the cross-sectional depth CD1 increases along the lengthwise direction LD1 while the cross-sectional width CW1 remains constant in the lengthwise direction LD1. Separately or in combination, the outgassing groove 110 may have different cross-sectional or plan-view geometries from the depicted embodiment. From a cross-sectional perspective, the outgassing groove 110 may have a u-shaped geometry, a trapezoid-shaped geometry, a flat-bottomed geometry, a completely curved geometry, a geometry comprising planar sidewalls, a geometry wherein the outer walls have convex or concave shape, or a geometry wherein the outer walls form rounded transitions with the bottom of the outgassing groove 110 and/or the planar mating surface 104, in various embodiments. From a plan-view perspective, the outgassing groove 110 may have a geometry comprising curves, e.g., a horn shape, may have a rectangular geometry, or a trapezoid shaped geometry, in various embodiments.

According to an embodiment, the cross-sectional area of each of the outgassing groove 110 increases continuously between the proximal end 112 and the distal end 114 along a lengthwise direction LD1. That is, the cross-sectional area of the outgassing groove 110 increases proportionally according to a linear function along the length of the outgassing groove 110. The depicted embodiment represents an example of this configuration, wherein both the cross-sectional depth CD1 and the cross-sectional width CW1 of each of the outgassing groove 110 increases continuously between the proximal end 112 and the distal end 114 of the respective outgassing groove 110. The rate of change may be different or the same as between the cross-sectional depth CD1 and the cross-sectional width CW1. In other embodiments, the increase in cross-sectional area of the outgassing groove 110 along the lengthwise direction LD1 may be non-linear. For example, the cross-sectional area may increase according to a second order (quadratic) coefficient. In another example, the increase in cross-sectional area may occur in a stepwise manner with discrete changes in the cross-sectional depth CD1 and/or the cross-sectional width CW1 occurring along the lengthwise direction LD1.

Referring again to FIG. 2, the outgassing grooves 110 may be arranged to extend to different sides of the electrical connection element 100 of the planar mating surface 104. In the depicted embodiment, the plurality of outgassing grooves 110 comprises a first subset of the outgassing grooves 110 that intersects a first span 116 of the rim 106 and a second subset of the outgassing grooves 110 that intersects a second span 118 of the rim 106 that is opposite from the first span 116. By utilizing multiple sides of the planar mating surface 104 and configuring the outgassing grooves 110 to draw trapped gasses away from the center of the planar mating surface 104 in multiple directions, a greater proportion of the trapped gasses may be removed. In the depicted embodiment, the first subset of the outgassing grooves 110 and the second subset of the outgassing grooves 110 each comprise multiple ones of the outgassing grooves 110. In principle, the first subset of the outgassing grooves 110 and the second subset of the outgassing grooves 110 may include as few as one of the outgassing grooves 110 or may include more than what is shown, depending on factors such as the size of the planar mating surface 104, size of the outgassing grooves 110, type of attachment material used in combination with the electrical connection element 100, etc. In the depicted embodiment, the first subset of the outgassing grooves 110 and the second subset of the outgassing grooves 110 alternate with one another in a vertical direction VD1 that is orthogonal to the lengthwise direction LD1. In this case, the outgassing grooves 110 alternate such that one of the outgassing grooves 110 from the first subset is followed by one of the outgassing grooves 110 from the second subset, which in turn is followed by one of the outgassing grooves 110 from the first subset, and so forth. Other alternating arrangements are possible. For example, the outgassing grooves 110 may be arranged to alternate along the vertical direction VD1 in a sequence of two or more of the outgassing grooves 110 from the first subset followed by two or more of the outgassing grooves 110 from the second subset, followed by two or more of the outgassing grooves 110 from the first subset, and so forth. In still other embodiments, the electrical connection element 100 may comprise subsets of the outgassing grooves 110 extending to different sides of the rim 106 without any alternating. For example, the outgassing groove 110 may comprise two subsets of the outgassing grooves 110 extending to opposite sides of the rim 106 and being arranged immediately opposite from one another.

The illustrated embodiment illustrates just one embodiment of an electrical connection element comprising a plurality of outgassing grooves 110 formed in a planar mating surface 104. More generally, an electrical connection element comprising the outgassing grooves 110 may be adapted to mate with a variety of assemblies. For example an electrical connection element comprising a planar mating surface 104 with the outgassing grooves 110 disclosed herein may be mated with a metal bonding surface of a lead frame, or a metal bonding surface of a circuit carrier, e.g., a PCB (printed circuit board), a DBC (direct bonded copper) substrate, IMS (insulated substrate) substrate or AMB (active metal brazed) substrate. In one example, an electrical connection element may be configured as a metal interconnect clip that is configured to mate with a bond pad from one semiconductor die and another metal bonding surface that is not from a semiconductor die, e.g., a metal bonding surface from a lead frame, or a structured metal pad of a circuit carrier. In this case, the electrical connection element may include planar mating surfaces 104 that are vertically offset from one another to effectuate the connection, with at least one of these planar mating surfaces 104 comprising the outgassing grooves 110. In another example, the electrical connection element may be configured exclusively as a heat sink structure. In this case, the electrical connection element may comprise a single mating surface and second surface opposite from the mating surface that may be exposed from a package body and be mated with an external heat sink structure. In another example, the mating platforms are 102 are omitted from the electrical connection element such that the rim 106 corresponds to an outermost edge side of an electrical connection element 100.

Figure 4:
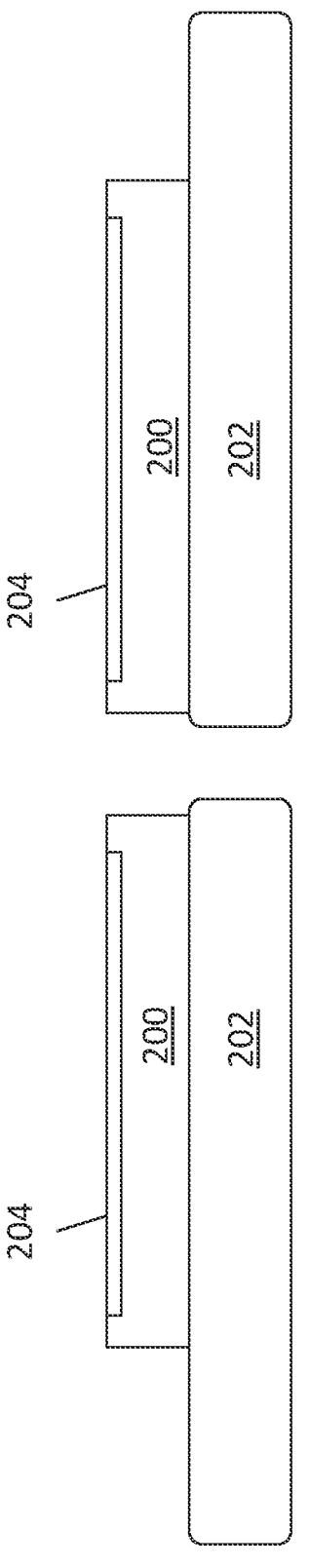
FIGS. 4-7 illustrate selected steps in a method of forming a semiconductor package using the electrical connection element, according to an embodiment.

Referring to FIG. 4, an assembly of a semiconductor die 200 mounted on a die pad 202 with a bond pad 204 of the semiconductor die 200 facing away from the die pad 202 is provided. The die pad 202 may correspond to any structure that is used to accommodate the mounting of a semiconductor die 200 thereon. For example, the die pad 202 may be provided from a metal lead frame that is used to form a molded semiconductor package. In another example, the die pad 202 may correspond to a structured metal region from a circuit carrier, e.g., a PCB or power electronics carrier.

Generally speaking, the semiconductor die 200 may have any of a wide variety of device configurations, e.g., discrete devices, logic devices, controllers, etc. According to an embodiment, the semiconductor die 200 is configured as a discrete power device that is rated to accommodate voltages of at least 100 V (volts), e.g., voltages of 600 V, 1200 V or more and/or is rated to accommodate currents of at least 1 A, e.g., currents of 10 A, 50 A, 100 A or more. Examples of these discrete power devices include diodes, transistors, thyristors, junction field effect transistors, etc. In a particular example, the semiconductor die 200 is configured as a power transistor die, for example MOSFET (Metal Oxide Semiconductor Field Effect Transistor), IGBTs (Insulated Gate Bipolar Transistor), and HEMT (High Electron Mobility Transistor), etc. In this embodiment, the bond pad 204 of the semiconductor die 200 that faces away from the die pad 202 may be correspond to a load terminal, e.g., source, drain, collector, emitter, etc. A rear side of the semiconductor die 200 may be mounted on the die pad 202 may be mounted using an attachment material, e.g., solder, sinter, conductive glue, etc.

In the depicted embodiment, the method comprises providing two separate assemblies, each of which comprise a semiconductor die 200 mounted on a die pad 202 with a bond pad 204 of the semiconductor die 200 facing away from the die pad 202. Both of the semiconductor dies 200 from these separate assemblies may have any of the configurations as described above. According to an embodiment, both of the semiconductor dies 200 from these separate assemblies are configured as the same type of discrete switching device, e.g., MOSFET, IGBT, HEMT, etc. The semiconductor dies 200 from these separate assemblies can be mounted in an opposite facing orientation, i.e., the bond pad 204 of one semiconductor die 200 corresponds to a source/emitter terminal and the bond pad 204 of one semiconductor die 200 corresponds to the drain/collector terminal. In that case, the electrical connection element 100 may be used to form an output (phase) connection of a half-bridge circuit. In another example, the semiconductor dies 200 from these separate assemblies are mounted with the bond pads having the same orientation. In that case, the electrical connection element 100 may be used to a power terminal connection in a parallel connected switch arrangement.

Figure 5:
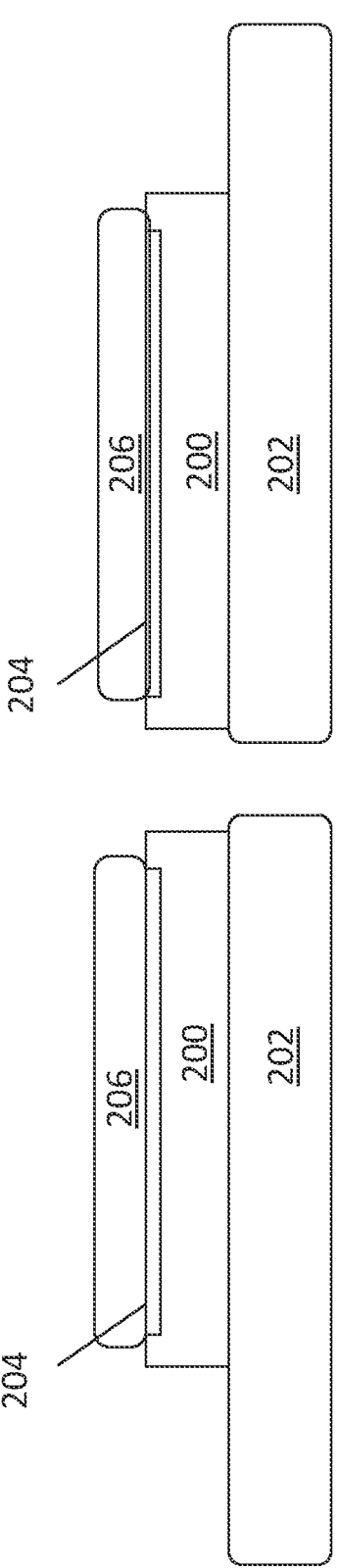

Referring to FIG. 5, regions of solder material 206 are applied to the bond pads 204 of the semiconductor dies 200. The regions of solder material 206 may comprise any type of solder that is suitable for electronics applications including eutectic solders and non-eutectic solders. The regions of solder material 206 may be a composition or alloy comprising any of the following: Sn, Cu, Ag, Au, Pb, Zn, In, Ga, Bi, C. According to an embodiment, the regions of solder material 206 comprise a solder paste composition that comprises the aforementioned conductive metals and a flux material. The flux aids in the cleaning of the surfaces to which the solder adheres to as well as aids in the flowing of the solder material before reflow.

Referring to FIG. 6, the electrical connection element 100 is arranged over the semiconductor dies 200 such that the planar mating surface 104 of the electrical connection element 100 contacts the regions of solder material 206. Subsequently, a solder reflow step is performed. The solder reflow step raises the temperature of the assembly to a reflow temperature of the solder material, i.e., a temperature at which the metals from the solder material react with the metals from the electrical connection element 100 and the bond pads 204, thereby forming a permanent metallurgical bond. Typical solder reflow temperatures are in the range of between about 200° C.-500° C., for example. After the reflow step, the assembly is cooled, thereby forming a mechanically stable and electrically conductive soldered joints from the regions of solder material 206.

The solder reflow step creates gaseous bubbles 208 within the regions of solder material 206. These gaseous bubbles 208 may be attributable the boiling and evaporation of the flux component of the solder material which occurs at the reflow temperature. Advantageously, the outgassing grooves 110 transport gas from the gaseous bubbles 208 into the ambient atmosphere, i.e., the air surrounding the assembly, during the solder reflow step. In doing so, the volume of gas that is trapped within the regions of solder material 206 is reduced in comparison to a similar arrangement between metal bonding surfaces that are completely planar and/or do not comprise any outgassing grooves 110. This mitigates the size and density of voids within the formed soldered joints, thereby improving quality factors such as thermal resistance, electrical resistance, and mechanical strength. The inventors have demonstrated that a reduction in the overall volume of the voids within a soldered joints in the range of 50% to 90% may be obtained by mating solder material to a surface with the outgassing grooves 110 in comparison to a similar arrangement between a completely planar metal bonding surface and solder material.

The above-described transportation of gas from the gaseous bubbles 208 results from the geometric configuration of the outgassing grooves 110 as described above. The outgassing grooves 110 create open pathways between top of the region of solder material 206 and the electrical connection element 100. Because the outgassing groove 110 have a cross-sectional area that increases in the lengthwise direction LD1 going from the proximal end 112 to the distal end 114, this creates a natural pressure differential along the lengthwise direction LD1 that draws the trapped gasses out from the interior of the assembly. That is, the outgassing groove 110 create a path for the trapped gas to move from locations of higher pressure to locations of lower pressure. A configuration wherein the cross-sectional depth CD1 the outgassing groove 110 increases along the lengthwise direction LD1 further enhances this effect. This arrangement creates an escape path to the exterior environment wherein the roof of the escape path, i.e., the bottom of the outgassing grooves 110, elevates as it moves towards the rim 106 of the electrical connection element 100. The heated gas bubbles naturally seeks higher elevation and thus the deepening of the outgassing grooves 110 induces an outward flow of the gas.

Figure 7:
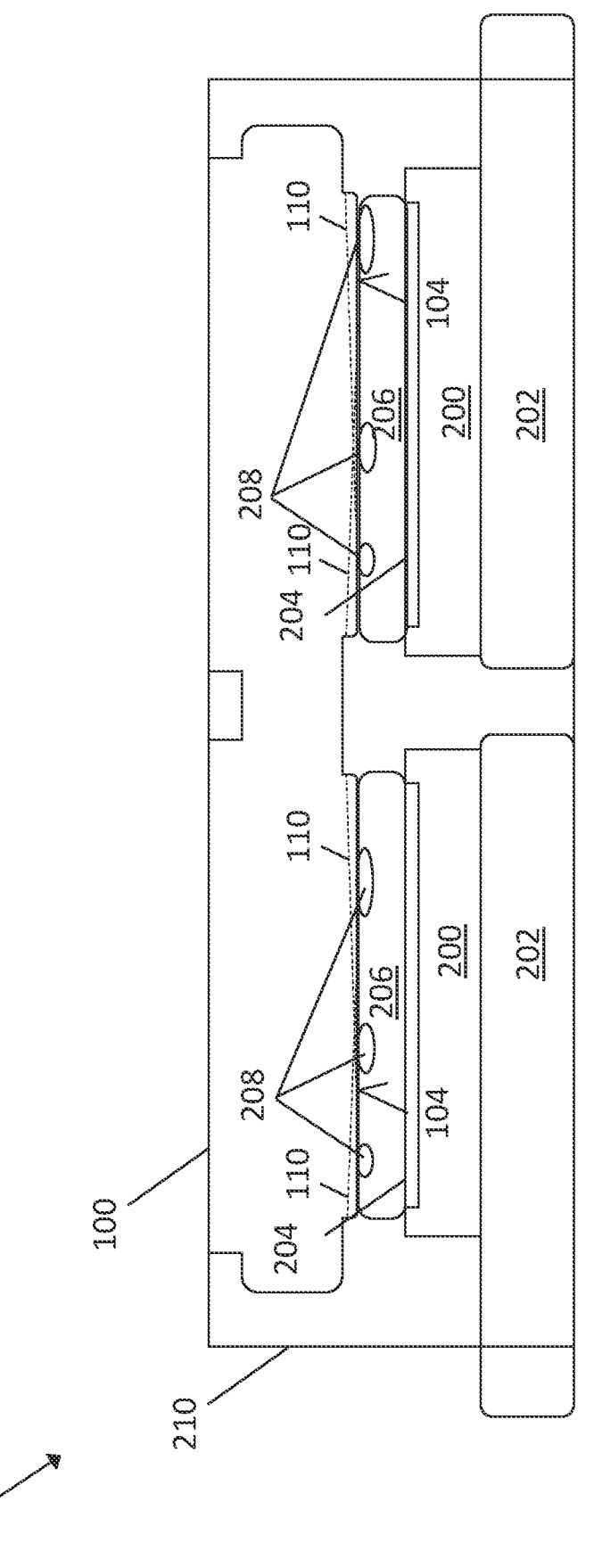

Referring to FIG. 7, a semiconductor package 300 may be formed from the assembly. The semiconductor package 300 may be formed with an electrically insulating encapsulant body 210 that encapsulates the semiconductor dies 200. The electrically insulating encapsulant body 210 may be formed by an encapsulation process whereby an electrically insulating mold compound comprising epoxy, thermosetting plastic, polymer, etc. is formed around the assembly, e.g., by injection molding, compression molding, transfer molding, etc. As shown, in addition to providing a die to die connection, the electrical connection element 100 may be configured as a heat sink that forms a thermally conductive path between the semiconductor dies 200 and an outside of the electrically insulating encapsulant body 210.

Instead of a molded semiconductor package as shown in FIG. 7, a semiconductor module may be formed from the assembly. In that case, the die pads 202 may correspond to structured regions of a circuit carrier such as a PCB or power electronics carrier. The semiconductor module may comprise a housing that surrounds the circuit carrier. An electrically insulating potting compound, e.g., a silicone based dielectric gel may be filled into the interior volume of a housing.

Figures 8, 8A, 8B:
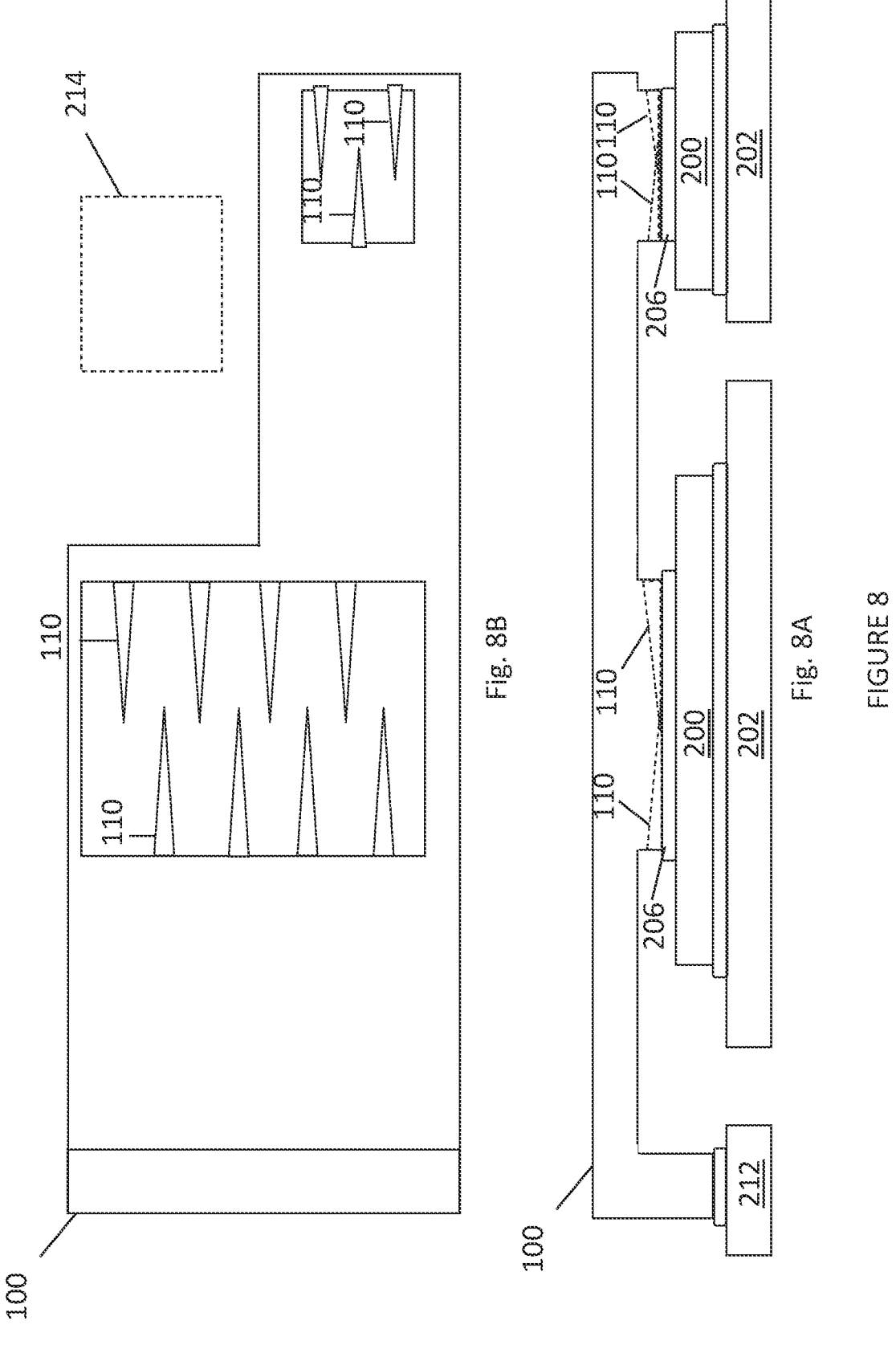
FIG. 8, which includes
FIGS. 8A and 8B, illustrates a semiconductor package assembly for forming a semiconductor package with an electrical connection element, according to an embodiment.

Referring to FIG. 8, an assembly is shown with an electrical connection element 100 arranged over the semiconductor dies 200, according to another embodiment. In this case, the assembly comprises a carrier that comprises two die pads 202 and a landing pad 212 adjacent to the die pads 202. The electrical connection element 100 is configured to mate with the bond pads 204 from each of the semiconductor dies 200 and the landing pad 212, thereby forming an electrical connection between the bond pads 204 of the semiconductor dies 200 and the landing pad 212. The electrical connection element 100 comprises outgassing grooves 110 that mate with the bond pads 204 of the semiconductor dies 200 in a similar manner as described above. The electrical connection element 100 may be soldered to the landing pad 212 as well. Optionally, the electrical connection element 100 may comprise outgassing grooves 110 that are configured to perform outgassing for the solder connection between the electrical connection element 100 and the landing pad 212. As shown in FIG. 8B, the electrical connection element 100 may be dimensioned to accommodate an additional die 214 that is not part of the electrical connection between the bond pads 204 of the semiconductor dies 200. The assembly of FIG. 8 may be encapsulated with an electrically insulating encapsulant body in a similar manner as described above to form a complete semiconductor package.

In addition to the depicted embodiments, the electrical connection element 100 disclosed herein may used in single die semiconductor package configurations. For instance, embodiments of the electrical connection element 100 and corresponding semiconductor packages disclosed herein include an embodiment similar to that of FIG. 8, except that the rightmost semiconductor die 200 and corresponding section of the electrical connection element 100 that interfaces with this semiconductor die 200 are omitted.

Although the present disclosure is not so limited, the following numbered examples demonstrate one or more aspects of the disclosure.

Example 1. An electrical connection element, comprising: a planar mating surface adapted for mating with a conductive bonding surface; a rim that forms an enclosed shape around the planar mating surface; and a plurality of outgassing grooves formed in the planar mating surface, wherein each of the outgassing grooves comprises a proximal end that is spaced apart from the rim and a distal end that intersects the rim, and wherein a cross-sectional area of each of the outgassing grooves increases along a lengthwise direction going from the proximal end to the distal end.

Example 2. The electrical connection element of example 1, wherein a cross-sectional depth of each of the outgassing grooves increases along the lengthwise direction.

Example 3. The electrical connection element of example 2, wherein a cross-sectional width of each of the outgassing grooves increases along the lengthwise direction.

Example 4. The electrical connection element of example 2, wherein each of the outgassing grooves has a v-shaped cross-sectional geometry.

Example 5. The electrical connection element of example 2, wherein each of the outgassing grooves has a cross-sectional geometry with curved sidewalls.

Example 6. The electrical connection element of example 2, wherein each of the outgassing grooves has a cross-sectional geometry with planar sidewalls.

Example 7. The electrical connection element of example 1, wherein the cross-sectional area of each of the outgassing grooves increases continuously between the proximal end and the distal end.

Example 8. The electrical connection element of example 1, wherein each of the outgassing grooves forms a triangle that widens along the lengthwise direction between the proximal end and the proximal end, the triangle being defined by an intersection between the planar mating surface and walls of the outgassing grooves.

Example 9. The electrical connection element of example 1, wherein the plurality outgassing grooves comprises a first subset of the outgassing grooves that intersects a first span of the rim and a second subset of the outgassing grooves that intersects a second span of the rim that is opposite from the first span.

Example 10. The electrical connection element of example 9, wherein the outgassing grooves from the first subset are arranged alternatingly with the outgassing grooves from the second subset along a vertical direction that is orthogonal to the lengthwise direction.

Example 11. The electrical connection element of example 1, wherein the electrical connection element is configured as a metal interconnect clip.

Example 12. The electrical connection element of example 11, further comprising: a second planar mating surface adapted for mating with a second metal bonding surface; a second rim that forms an enclosed shape around the second planar mating surface; and a second plurality of the outgassing grooves formed in the second planar mating surface.

Example 13. A method of forming an electrical connection in a semiconductor device, the method comprising: providing an electrical connection element that comprises a planar mating surface, a rim that forms an enclosed shape around the planar mating surface, and a plurality of outgassing grooves formed in the planar mating surface, wherein each of the outgassing grooves comprises a proximal end that is spaced apart from the rim and a distal end that intersects the rim, and wherein a cross-sectional area of each of the outgassing grooves increases along a lengthwise direction going from the proximal end to the distal end; providing an assembly of a semiconductor die mounted on a die pad with a bond pad of the semiconductor die facing away from the die pad; applying a region of solder material to the bond pad; arranging the planar mating surface of the electrical connection element on the region of solder material; and performing a solder reflow step that reflows the region of solder material to form a soldered joint between the bond pad and the electrical connection element.

Example 14. The method of example 13, wherein the solder reflow step creates gaseous bubbles within the region of solder material, and wherein the outgassing grooves transport gas from the gaseous bubbles into an ambient atmosphere during the solder reflow step.

Example 15. The method of example 14, wherein the rim comprises a first span and a second span that is opposite form the first span, wherein the plurality of outgassing grooves comprises a first subset of the outgassing grooves that intersects the first span and a second subset of the outgassing grooves that intersects the second span, and wherein each of the outgassing grooves from the first subset and from the second subset transport gas from the gaseous bubbles into the ambient atmosphere during the solder reflow step.

Example 16. The method of example 13, wherein a cross-sectional depth of each of the outgassing grooves increases along the lengthwise direction, and wherein a cross-sectional depth of each of the outgassing grooves increases along the lengthwise direction.

Example 17. The method of example 13, wherein the electrical connection element further comprises a second planar mating surface, a second rim that forms an enclosed shape around the second planar mating surface, and a second plurality of the outgassing grooves formed in the second planar mating surface, and wherein the method further comprises: providing the assembly to comprise a second semiconductor die mounted on the die pad with a bond pad of the second semiconductor die facing away from the die pad; applying a second region of solder material to the bond pad of the second semiconductor die; arranging the second planar mating surface of the electrical connection element on the second region of solder material; and performing the solder reflow step to reflows the second region of solder material to form a second soldered joint between the bond pad of the second semiconductor die and the electrical connection element.

Example 18. A semiconductor package, comprising: a semiconductor die mounted on a die pad with a bond pad of the semiconductor die facing away from the die pad; an electrical connection element that comprises a planar mating surface, a rim that forms an enclosed shape around the planar mating surface, and a plurality of outgassing grooves formed in the planar mating surface, wherein each of the outgassing grooves comprises a proximal end that is spaced apart from the rim and a distal end that intersects the rim, and wherein a cross-sectional area of each of the outgassing grooves increases along a lengthwise direction going from the proximal end to the distal end; and a soldered joint between the planar mating surface of the electrical connection element and the bond pad of the semiconductor die.

Example 19. The semiconductor package of example 18, wherein a cross-sectional depth of each of the outgassing grooves increases along the lengthwise direction, and wherein a cross-sectional width of each of the outgassing grooves increases along the lengthwise direction.

Example 20. The semiconductor package of example 18, wherein the electrical connection element is configured as a metal interconnect clip.

Example 21. The semiconductor package of example 20, wherein the electrical connection element further comprises a second planar mating surface adapted for mating with a second bond pad, a second rim that forms an enclosed shape around the planar mating surface, and a second plurality of the outgassing grooves formed in the second planar mating surface, wherein the semiconductor package further comprises: a second semiconductor die mounted on the die pad with a bond pad of the second semiconductor die facing away from the die pad, and a second soldered joint between the second planar mating surface of the electrical connection element and the bond pad of the second semiconductor die.

Example 22. The semiconductor package of example 18, wherein the semiconductor package comprises an electrically insulating encapsulant body that encapsulates the semiconductor die, and electrical connection element is a heat sink that forms a thermally conductive path between the semiconductor die and an outside of the electrically insulating encapsulant body.

The semiconductor die disclosed herein can be formed in a wide variety of device technologies that utilize a wide variety of semiconductor materials. Examples of such materials include, but are not limited to, elementary semiconductor materials such as silicon (Si) or germanium (Ge), group IV compound semiconductor materials such as silicon carbide (SIC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), etc.

The semiconductor die disclosed herein may be configured as a vertical device, which refers to a device that conducts a load current between opposite facing main and rear surfaces of the die. Alternatively, the semiconductor die may be configured as a lateral device, which refers to a device that conducts a load current parallel to a main surface of the die.

As used herein, the term "electrical connection element" refers to a structure that forms and electrically conductive and/or thermally conductive connection via soldering with a thermally and/or electrically conductive joining surface, e.g., from a semiconductor package or semiconductor module. The joining surface can be bond pad of another semiconductor die, a bonding surface of a lead frame, or a bonding surface of a circuit carrier, e.g., a PCB (printed circuit board), a DBC (direct bonded copper) substrate, IMS (insulated substrate) substrate or AMB (active metal brazed) substrate. One example of an electrical connection element is an interconnect clip that is used to form electrical connection between the bond pad of a semiconductor die and another metal bonding surface, e.g., the bond pad of another semiconductor die, a metal bonding surface from a lead frame, or a structured metal pad of a PCB or power electronics substrate. Another example of an electrical connection element is a heat sink that is used to radiate heat away from a heat generating element. A heat sink may be mated with a metal bonding surface of the heat generating element, such as a load terminal of a power transistor die. An electrical connection element may be configured as both an interconnect clip and heat sink.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An electrical connection element, comprising:
   a planar mating surface adapted for mating with a conductive bonding surface;
   a rim that forms an enclosed shape around the planar mating surface; and
   a plurality of outgassing grooves formed in the planar mating surface,
   wherein each of the outgassing grooves comprises a proximal end that is spaced apart from the rim and a distal end that intersects the rim, and
   wherein a cross-sectional area of each of the outgassing grooves increases along a lengthwise direction going from the proximal end to the distal end.

2. The electrical connection element of claim 1, wherein a cross-sectional depth of each of the outgassing grooves increases along the lengthwise direction.

3. The electrical connection element of claim 2, wherein a cross-sectional width of each of the outgassing grooves increases along the lengthwise direction.

4. The electrical connection element of claim 2, wherein each of the outgassing grooves has a v-shaped cross-sectional geometry.

5. The electrical connection element of claim 2, wherein each of the outgassing grooves has a cross-sectional geometry with curved sidewalls.

6. The electrical connection element of claim 2, wherein each of the outgassing grooves has a cross-sectional geometry with planar sidewalls.

7. The electrical connection element of claim 1, wherein the cross-sectional area of each of the outgassing grooves increases continuously between the proximal end and the distal end.

8. The electrical connection element of claim 1, wherein each of the outgassing grooves forms a triangle that widens along the lengthwise direction between the proximal end and the proximal end, the triangle being defined by an intersection between the planar mating surface and walls of the outgassing grooves.

9. The electrical connection element of claim 1, wherein the plurality outgassing grooves comprises a first subset of the outgassing grooves that intersects a first span of the rim and a second subset of the outgassing grooves that intersects a second span of the rim that is opposite from the first span.

10. The electrical connection element of claim 9, wherein the outgassing grooves from the first subset are arranged alternatingly with the outgassing grooves from the second subset along a vertical direction that is orthogonal to the lengthwise direction.

11. The electrical connection element of claim 1, wherein the electrical connection element is configured as a metal interconnect clip.

12. The electrical connection element of claim 11, further comprising:
    a second planar mating surface adapted for mating with a second metal bonding surface;
    a second rim that forms an enclosed shape around the second planar mating surface; and
    a second plurality of the outgassing grooves formed in the second planar mating surface.

13. A method of forming an electrical connection in a semiconductor device, the method comprising:
    providing an electrical connection element that comprises a planar mating surface, a rim that forms an enclosed shape around the planar mating surface, and a plurality of outgassing grooves formed in the planar mating surface, wherein each of the outgassing grooves comprises a proximal end that is spaced apart from the rim and a distal end that intersects the rim, and wherein a cross-sectional area of each of the outgassing grooves increases along a lengthwise direction going from the proximal end to the distal end;
    providing an assembly of a semiconductor die mounted on a die pad with a bond pad of the semiconductor die facing away from the die pad;
    applying a region of solder material to the bond pad;
    arranging the planar mating surface of the electrical connection element on the region of solder material; and
    performing a solder reflow step that reflows the region of solder material to form a soldered joint between the bond pad and the electrical connection element.

14. The method of claim 13, wherein the solder reflow step creates gaseous bubbles within the region of solder material, and wherein the outgassing grooves transport gas from the gaseous bubbles into an ambient atmosphere during the solder reflow step.

15. The method of claim 14, wherein the rim comprises a first span and a second span that is opposite form the first span, wherein the plurality of outgassing grooves comprises a first subset of the outgassing grooves that intersects the first span and a second subset of the outgassing grooves that intersects the second span, and wherein each of the outgassing grooves from the first subset and from the second subset transport gas from the gaseous bubbles into the ambient atmosphere during the solder reflow step.

16. The method of claim 13, wherein a cross-sectional depth of each of the outgassing grooves increases along the lengthwise direction, and wherein a cross-sectional depth of each of the outgassing grooves increases along the lengthwise direction.

17. The method of claim 13, wherein the electrical connection element further comprises a second planar mating surface, a second rim that forms an enclosed shape around the second planar mating surface, and a second plurality of the outgassing grooves formed in the second planar mating surface,
    providing the assembly to comprise a second semiconductor die mounted on the die pad with a bond pad of the second semiconductor die facing away from the die pad;
    applying a second region of solder material to the bond pad of the second semiconductor die;
    arranging the second planar mating surface of the electrical connection element on the second region of solder material; and
    performing the solder reflow step to reflows the second region of solder material to form a second soldered joint between the bond pad of the second semiconductor die and the electrical connection element.

18. A semiconductor package, comprising:
    a semiconductor die mounted on a die pad with a bond pad of the semiconductor die facing away from the die pad;
    a electrical connection element that comprises a planar mating surface, a rim that forms an enclosed shape around the planar mating surface, and a plurality of outgassing grooves formed in the planar mating surface, wherein each of the outgassing grooves comprises a proximal end that is spaced apart from the rim and a distal end that intersects the rim, and wherein a cross-sectional area of each of the outgassing grooves increases along a lengthwise direction going from the proximal end to the distal end; and
    a soldered joint between the planar mating surface of the electrical connection element and the bond pad of the semiconductor die.

19. The semiconductor package of claim 18, wherein a cross-sectional depth of each of the outgassing grooves increases along the lengthwise direction, and wherein a cross-sectional width of each of the outgassing grooves increases along the lengthwise direction.

20. The semiconductor package of claim 18, wherein the electrical connection element is configured as a metal interconnect clip.

21. The semiconductor package of claim 20, wherein the electrical connection element further comprises a second planar mating surface adapted for mating with a second bond pad, a second rim that forms an enclosed shape around the planar mating surface, and a second plurality of the outgassing grooves formed in the second planar mating surface, wherein the semiconductor package further comprises:
    a second semiconductor die mounted on the die pad with a bond pad of the second semiconductor die facing away from the die pad, and
    a second soldered joint between the second planar mating surface of the electrical connection element and the bond pad of the second semiconductor die.

22. The semiconductor package of claim 18, wherein the semiconductor package comprises an electrically insulating encapsulant body that encapsulates the semiconductor die, and electrical connection element is a heat sink that forms a thermally conductive path between the semiconductor die and an outside of the electrically insulating encapsulant body.

* * * * *